(12) United States Patent
Koh et al.

(10) Patent No.: US 6,737,738 B2
(45) Date of Patent: May 18, 2004

(54) MULTI-LEVEL PACKAGE FOR A MEMORY MODULE

(75) Inventors: Wei H. Koh, Irvine, CA (US); David H. Chen, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 0 days.

(21) Appl. No.: 10/195,995

(22) Filed: Jul. 16, 2002

(65) Prior Publication Data

US 2004/0012992 A1 Jan. 22, 2004

(51) Int. Cl.$^7$ ............................................. H01L 23/02
(52) U.S. Cl. ........................ 257/686; 257/685; 257/730; 257/750; 257/777
(58) Field of Search .............................. 257/345, 686, 257/685, 730, 750, 777

(56) References Cited

U.S. PATENT DOCUMENTS

| | | | | |
|---|---|---|---|---|
| 5,045,914 A | * | 9/1991 | Casto et al. | 257/693 |
| 5,138,438 A | * | 8/1992 | Masayuki et al. | 257/686 |
| 5,754,408 A | * | 5/1998 | Derouiche | 361/773 |
| 6,294,838 B1 | * | 9/2001 | Peng | 257/777 |
| 6,369,448 B1 | * | 4/2002 | McCormick | 257/777 |
| 6,621,156 B2 | * | 9/2003 | Kimura | 257/686 |
| 6,621,172 B2 | * | 9/2003 | Nakayama et al. | 257/787 |

* cited by examiner

Primary Examiner—Richard Elms
Assistant Examiner—Douglas Menz
(74) Attorney, Agent, or Firm—Morland C. Fischer

(57) ABSTRACT

A high density, low profile, three dimensional memory module having multi-level semiconductor packages mounted on one or opposite sides of a printed wiring board. Each multi-level package of the memory module contains an upper level DRAM integrated circuit package that is surface mounted on the printed wiring board and at least one lower level DRAM integrated circuit package that is surface mounted on the printed wiring board below the upper level package, such that the upper and lower level packages are stacked one above the other. The upper level package is preferably a thin small outline package, and the lower level package is preferably a leadless chip scale package. The leads of the upper level package are of sufficient length so that the standoff height of the upper level package establishes a clearance thereunder in which to receive the lower level package. The lower level package is characterized by a smaller footprint and profile than the corresponding footprint and profile of the upper level package.

21 Claims, 3 Drawing Sheets

MULTI-LEVEL PACKAGE FOR A MEMORY MODULE

BACKGROUND OF THE INVENTION

1. Field of the Invention

This invention relates generally to semiconductor memory modules and, more particularly, to multi-level packages wherein an upper and at least one lower level DRAM integrated circuit packages are stacked one over the other by which to assemble a high density, low profile, three-dimensional memory module.

2. Background Art

A conventional memory module for dynamic random access memory (DRAM) semi-conductor integrated circuits typically includes a printed wiring board (PWB) substrate card and a number of DRAM integrated circuit (IC) packages mounted to the PWB card by means of surface mount technology. Running along one edge of the PWB card is a row of gold plated metallic contact pads or fingers to be inserted into a connector socket that is mounted at a mother board. These multi-package modules are generally referred to as either a single in-line memory module (SIMM) or a dual in-line memory module (DIMM), depending upon whether the gold finger contacts on the PWB card edge are isolated or interconnected to the packages on both sides of the card by way of through holes. Typically, a single row of DRAM packages numbering from four to nine is mounted on one side of the module. Both sides of a single SIMM or DIMM module can be populated to increase the number of integrated circuit packages on board. This is often referred to as a normal or monolithic assembly of memory modules. The number of packages that can be mounted is limited by the size of the SIMM or DIMM modules that are regulated by internationally accepted standards.

The internal content of the DRAM memory density, commonly measured in terms of megabits, plus the number of the packages assembled per memory module determines the total module density, measured in megabytes. Hence, a DIMM module containing eight 128 Mb DRAM packages produces a module with 128 MB of memory density.

It is often desirable to increase the memory densities within the given space on a single DIMM. The usual monolithic assembly of packages to fabricate a memory module is limited by the space that is available to mount the DRAM packages. For a standard DIMM module populated on both sides of the PWB card, the typical number of DRAM packages is 18, by using lead frame packages such as thin small outline packages (TSOP) or even smaller sized chip scale packages (CSP) and fine pitch ball grid array (FBGA) packages. To double the memory density within a given DIMM module, the usual solution has been to use pre-stacked DRAM packages. In order to solder the leads of the top and bottom stacked packages together, an intermediate medium, or interposer, is often used. This interposer needs to contain simple circuitry to reroute the chip select function of the top package to the interconnecting pads on the PWB card, because the upper and lower packages are overlapping in the space originally intended for just a single package.

As a result of the foregoing, separate chip select signal traces are needed to identify the top DRAM package and distinguish it from the bottom package. An additional and separate assembly process is required to first join the leads of the upper package to the lower package. Furthermore, after the stacking assembly is completed, each pair of stacked DRAMs, must be electrically tested again and visually inspected to ensure that the stacked arrangement is functional.

When assembled to the DIMM module cards, the stacked packages can achieve the goal of doubling the amount of the memory density. However, depending upon the shape and location of the leads which join the top and the bottom packages, the pair of packages that are stacked one above the other often presents problems to assembly machines, such as a chip placement machine, by confusing its vision system for checking the lead pattern. What is even more, once the stacked package is assembled, in the situation where one of the two stacked packages is not functioning correctly and is in need of repair, the entire stacked package must be removed from the DIMM module and replaced. Therefore, even though only one of the two packages in the stacked pair of packages is malfunctioning, the other properly functioning package must nevertheless be sacrificed.

Accordingly, what is needed is an efficient means for doubling the memory density in a memory module which avoids the disadvantages described above while minimizing the assembly cost, reducing assembly time, and avoiding additional waste and inefficiency that is incurred during testing and repair.

Examples of stacked semiconductor integrated circuits mounted on a substrate are available by referring to the following United States patents:

| | |
|---|---|
| 5,861,666 | Jan. 19, 1999 |
| 5,960,539 | Oct. 5, 1999 |
| 6,205,654 | Mar. 27, 2001 |
| 6,242,285 | Jun. 5, 2001 |
| 6,329,221 | Dec. 11, 2001 |

SUMMARY OF THE INVENTION

In general terms, multi-level packages comprising dynamic random access memory (DRAM) semi-conductor integrated circuit (IC) devices are surface mounted to one or both sides of a printed wiring board substrate in order to manufacture a high density, low profile, three dimensional memory module (e.g. either a single in-line or a dual in-line memory module). Each multi-level package includes different upper and lower level DRAM IC packages that are efficiently stacked one above the other so as to occupy no more space on the board than that normally occupied by a single upper level IC package. In a preferred embodiment, the upper level IC package of each stacked package is a lead frame package, such as a thin small outline package (TSOP), and the lower level package is a chip scale package (CSP). The leads of the upper level (TSOP) package are of sufficient length so that the standoff height of the upper level package is taller than a standard package so as to provide a sufficient clearance thereunder in which to receive at least one lower level (CSP) package. In this same regard, the lower level (CSP) package is a leadless device that is characterized by a smaller footprint and profile than the corresponding footprint and profile of the upper level package.

The leadless lower level IC package of the stacked pair of packages is electrically connected to the printed wiring board substrate by means of solder balls and surface contact bonding pads. The upper level IC package is connected to the printed wiring board substrate by means of its relatively long leads and surface contact bonding pads. At least some pairs of the bonding pads associated with each of the upper and lower level IC packages are interconnected with one another either along the surface of the substrate or at interior layers thereof so as to be capable of sharing the same signal traces, whereby the bonding pads of the upper and lower packages can be connected in electrical common on a memory module. Because the upper and lower level packages are physically isolated, there is no need for an intermediate interposer, common to pre-stacked packaging, to reroute the chip select pin. Thus, the necessity for adding an interposer between the upper and lower level IC packages is avoided so that the total number of stacked packages that can be assembled for manufacturing a standard monolithic memory module can be doubled relative to a conventional memory module without consuming additional space on the substrate.

DETAILED DESCRIPTION

Figure 1:
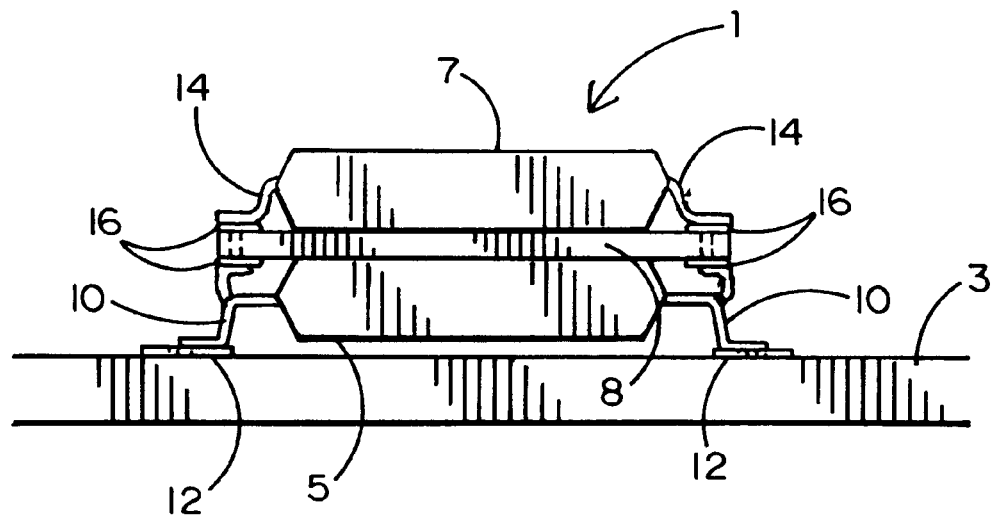
FIG. 1 shows a conventional prestacked package containing identical upper and lower IC packages that are connected together one above the other and mounted on a printed wiring board.

FIG. 1 of the drawings illustrates a conventional prestacked package 1 mounted on a printed wiring board (PWB) 3. A lower integrated circuit (IC) package 5 is supported on one side of the printed wiring board 3 and an identical upper IC package 7 is supported above the lower IC package 5 on top of an interposer or intermediate circuit board 8 such that the lower and upper IC packages 5 and 7 sit on opposite sides of interposer 8. The leads 10 of the lower IC package 5 are electrically connected to the printed wiring board 3 at respective electrically conductive pads 12. The leads 14 from the upper IC package 7 are electrically connected to the leads 10 of lower IC package 5 by means of solder connections 16 through interposer 8.

The stacked package 1 of FIG. 1 is sometimes large (e.g. greater than twice the thickness of a single IC package 5 or 7). Thus, such a conventional stacking arrangement is known to consume more area than is desirable within a memory module. Moreover, the presence of interposer board 8 between the lower and upper IC packages 5 and 7 subjects the packages to excess heat which could effect the performance of the module. That is to say, there is no space for airflow between the IC packages 5 and 7 seated on opposite sides of the interposer 8. As described above, an identical pair of upper and lower IC packages 5 and 7 are stacked one above the other with the leads 10 and 14 thereof electrically connected to each other and to the same pad 12 on the printed wiring board 3. As a consequence of the foregoing, additional trace lines will be required in order to carry independent chip select signals from a controller to individual ones of the packages 5 and 7. The necessity of additional trace lines for accessing each of the stacked upper and lower IC packages 5 and 7 further contributes to the consumption of space on the board 3.

Figure 2:
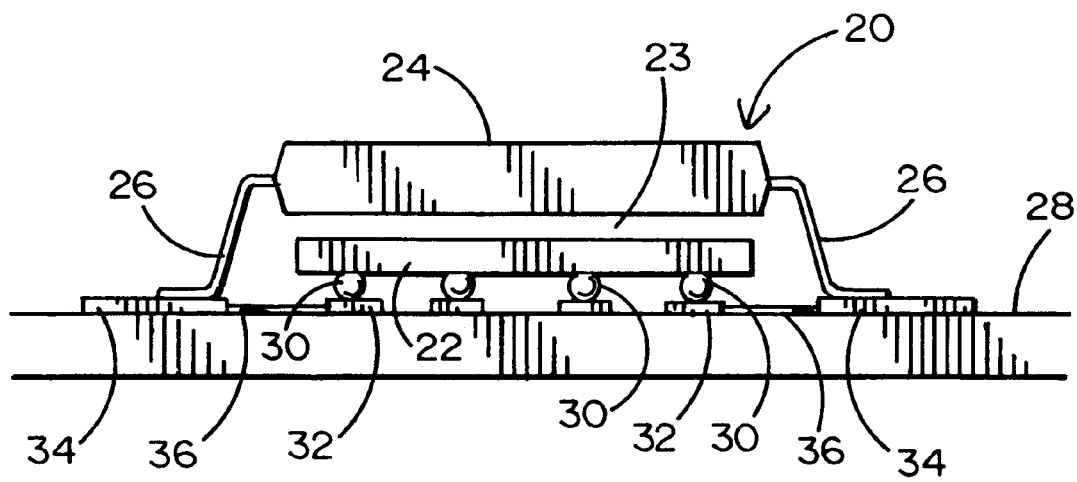
FIG. 2 shows the semiconductor package which forms the present invention containing upper and lower level IC packages of different size and profile that are stacked one above the other and mounted by respective bonding pads on a printed wiring board.

FIG. 2 of the drawings shows a compact, low profile arrangement for stacking IC semiconductor packages one above the other so as to avoid the shortcomings which are inherent with the conventional stacked package arrangement 1 of FIG. 1. By virtue of the soon to be described multi-level stacked package 20, a pair of semiconductor packages can be positioned one above the other so as to occupy about the same space that would be normally used by a single surface mount assembly package. Although it is contemplated that the multi-level semiconductor package 20 of FIG. 2 will be part of a multi-chip DRAM array common to a memory module, it is to be understood that the advantages of the stacked package 20 are not limited to memory modules but may also be extended to other high density semiconductor packaging applications.

Each stacked package 20 of FIG. 2 includes at least one lower level IC package 22 and an upper level IC package 24. The lower level IC package 22 is preferably a conventional chip scale package (CSP) such as, for example, a suitable fine pitch ball grid array (FBGA) package, including microBGAs and memory BGAs. The upper level IC package 24 is preferably a plastic lead frame semiconductor package such as, for example, a thin small outline package (TSOP) having either gull-wing leads 26 (as shown) or J-shaped leads running downwardly towards the printed wiring board substrate 28.

In accordance with an important detail of this invention, the leads 26 must have a sufficient length so that the standoff height of the upper level IC package 24 is both taller than a standard TSOP package and able to provide a sufficient clearance over the lower level IC package 22. This will enable an airspace 23 to be established to prevent excess heating of the opposing packages 22 and 24. By way of example only, it has been found that the top of the upper level package 24 should lie about 2.1 mm above the PWB substrate 28. This relatively tall vertical height of the upper level package 24 is achieved by increasing the sloped portion of the leads 26 to create room under upper package 24 for receipt of the lower level package 22.

The lower level chip scale package 22 is shown having ball grid array solder balls 30 for electrical connection to the PWB substrate 28. The lower level package 22 is characterized by a relatively small footprint and profile so as to be able to fit under the upper package 24. The upper level thin small outline package 24 has a large footprint area to completely cover the lower level package 22. In this regard, unlike the stacked packages 5 and 7 shown in FIG. 1, the lower and upper level packages 22 and 24 of FIG. 2 have different sizes, although the respective IC devices thereof will typically have an identical size. By way of example only, it has been found that the top of the lower level IC package 22 should lie about 1.0 to 1.4 mm above the PWB substrate 28.

The PWB substrate 28 for the stacked package 20 of FIG. 2 includes surface contact bonding pads 32 and 34 that are capable of sharing the same signal traces (not shown), whereby some pairs of bonding pads 30 and 34 associated with the lower and upper level packages 22 and 24 can be connected in electrical common on a memory module. While either one of the upper or level package of a conventional stacked package was connected to the substrate, the PWB substrate 28 of FIG. 2 is provided with bonding pads 32 and 34 so that both of the upper and lower packages 24 and 22 are connected directly to substrate 28. That is, the lower level package is electrically connected to the PWB substrate 28 at pads 32 by means of the array of solder balls 30, and the upper level package 24 is connected to substrate 28 at pads 34 by means of leads 26.

In the case of the stacked package 20 of FIG. 2, a pair of contact bonding pads 32 and 34 are connected together by a trace 36 on the surface of the PWB substrate 28. However, it is to be understood that certain other pads associated with chip select and clock functions for the lower and upper packages 22 and 24 may not be connected together. It can be appreciated that to further minimize space consumption, the smaller lower level (CSP) package 22 has no leads, while the larger upper level (TSOP) package 24 is connected directly to the surface of PWB substrate 28 (rather than to the lower level package, as in the conventional package 1 shown in FIG. 1) by means of relatively long gull-wing leads 26.

Figure 3:
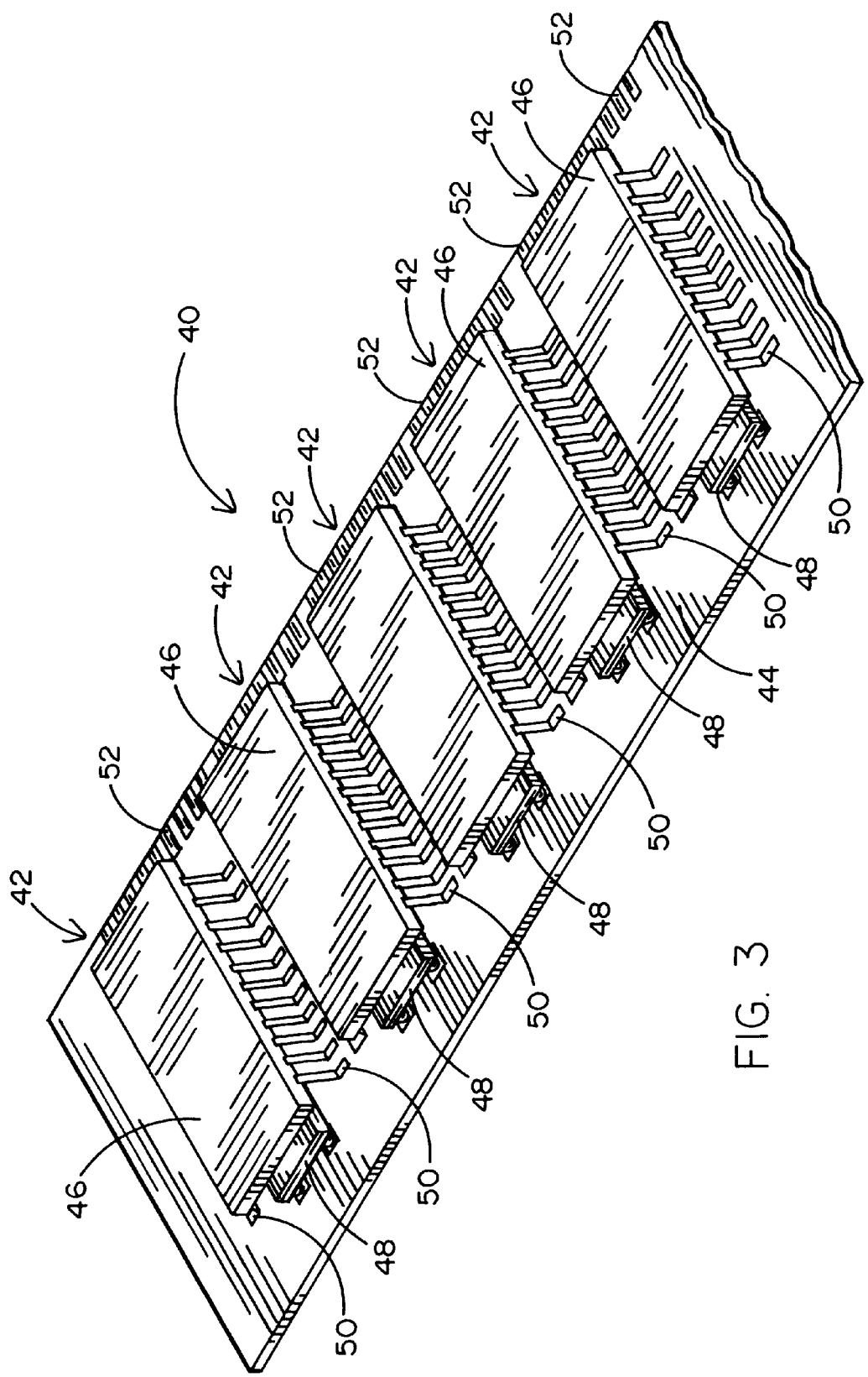
FIG. 3 shows a memory module wherein a series of the multi-level stacked packages of FIG. 2 are surface mounted on one side of a printed wiring board.

Turning now to FIG. 3 of the drawings, there is shown a high density, low profile, three-dimensional memory module 40 wherein a row containing a plurality of (e.g. eight or nine) stacked packages 42 (such as that designated 20 in FIG. 2) is arranged along the top of a printed wiring board substrate 44. Therefore, as previously described, each of the stacked packages 42 of FIG. 3 includes an upper level DRAM IC (e.g. a conventional TSOP 46) positioned above and covering a lower level DRAM IC (e.g. a conventional CSP 48). In this case, the upper level TSOP 46 is electrically connected to substrate 44 by means of gull-wing leads 50 and corresponding outer perimeter contact pads. The lower level CSP 48 is electrically connected to substrate 44 by means of solder balls and interior contact pads. The usual row of gold plated metallic contact pads 52 runs along one edge of the substrate 44 to enable the connection of memory module 40 to a suitable connector.

By virtue of the foregoing, the total number of stacked packages 46 and 48 that are assembled for manufacturing a standard monolithic memory module is doubled relative to a conventional memory module without consuming additional space on the PWB substrate 44. For example, where it has been conventional to assemble nine DRAM IC packages on one side of a substrate to manufacture a single in-line memory module (SIMM), the number of IC packages can now be increased to 18. In this same regard, the memory density content of the SIMM is correspondingly doubled.

Moreover, because the upper level TSOP packages 46 of memory module 40 will be plastic molded overhanging lead frame devices, mechanical protection is offered for the lower level CSP packages 48 that often have exposed die backside that are susceptible to damage. What is even more, the memory module 40 can be manufactured using available surface mount equipment and processes without requiring specially prefabricated stacked packages. In addition, in the event that the upper level TSOP package 46 should become defective, it can be removed from the substrate 44 independently of the lower level CSP package 48 and replaced without having to scrap the entire stacked package 42. Accordingly, initial assembly and rework costs of the memory module 40 containing the stacked DRAM IC packages 42 as disclosed above is lower than the costs associated with prior art memory modules that use prestacked memory packages such as those shown in FIG. 1.

Figure 4:
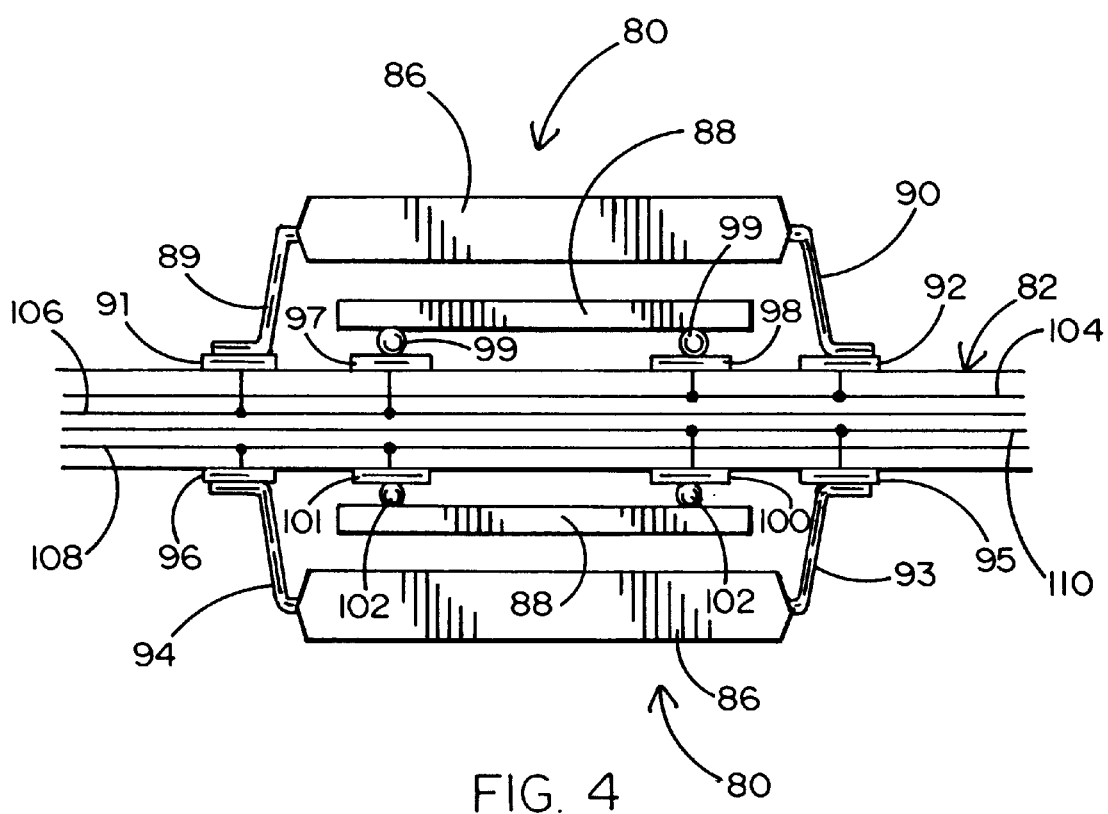
FIG. 4 shows a multi-level stacked package of FIG. 2 mounted at opposite sides of a multi-layer printed wiring board.

Referring to FIG. 4 of the drawings, an arrangement of multi-level stacked packages 80 comprising pairs of two different DRAM IC packages is shown by which the total number of devices that can be assembled to manufacture a high density, low profile, three-dimensional memory module is increased to 36 by using both sides of a multi-layer printed wiring board substrate 82. This arrangement is particularly applicable to manufacturing a dual in-line memory module (DIMM) which has heretofor commonly employed a total of 18 IC packages. Each of the stacked packages 80 that is surface mounted on each side of substrate 82 includes an upper level (e.g. TSOP) package 86 and a lower level (e.g. CSP) package 88. The leads 89 and 90 of the upper level package 86 on the top of substrate 82 are connected to respective contact bonding pads 91 and 92, and the leads 93 and 94 of the upper level package 86 on the bottom of substrate 82 are connected to respective contact bonding pads 95 and 96. The leadless lower level package 88 on the top of the substrate 82 is connected to contact bonding pads 97 and 98 by solder balls 99, and the leadless lower level package 88 on the bottom of the substrate 82 is connected to contact bonding pads 100 and 101 by solder balls 102.

At least some of the pairs of perimeter and interior contact bonding pads 92 and 98 associated with the multi-level stacked packages 86 and 88 at the top of the multi-layer printed wiring board substrate 82 are connected in electrical common by a first signal line 104 at an interior layer of the substrate 82. The pair of perimeter and interior contact bonding pads 91 and 97 associated with the same multi-level stacked packages 86 and 88 are connected in electrical common by a second signal line 106 at an interior layer of the substrate 82. The pair of perimeter and interior contact bonding pads 96 and 101 that are associated with the multi-level stacked packages 86 and 88 at the bottom of the multi-layer printed wiring board substrate 82 are connected in electrical common by a third signal line 108 at an interior layer of the substrate 82. The pair of perimeter and interior contact bonding pads 95 and 100 associated with the same multi-level stacked packages 86 and 88 are connected in electrical common by a fourth signal line 110 at an interior layer of the substrate 82.

Because the upper and lower level IC packages 86 and 88 mounted at the top and bottom of the printed wiring board substrate 82 require no pre-assembly, no additional cost in assembly and testing is incurred as would otherwise be the case in a conventional DIMM in which prestacked packages are used. Accordingly, the cost and time associated with assembling the stacked package 80 of FIG. 4 to manufacture a memory module are advantageously reduced. Likewise, because the upper and lower packages 86 and 88 are independent prior to assembly, they can also be used as single level devices as part of the conventional monolithic assembly of a memory module. While the stacked packages 20 and 80 of FIGS. 2 and 4 show only a single lower level IC device located in the space created below the upper level IC device, it is within the scope of this invention for two or more relatively small lower level devices to be mounted on a printed wiring board under a larger upper level device.

We claim:

1. A multi-level package arrangement comprising stacked integrated circuit (IC) semiconductor packages mounted on a printed wiring board, said multi-level packaging arrangement comprising:

an upper level IC package having a plurality of leads projecting therefrom by which to said upper level IC package is connected to the printed wiring board; and a lower level IC package mounted on the printed wiring board, the upper level IC package having a footprint which is larger than the footprint of said lower level IC package such that the plurality of leads projecting from said upper level IC package lie entirely outside of said lower level package, and the plurality of leads of said upper level IC package being sufficiently long to create a space between said upper level IC package and the printed wiring board, said lower level package being mounted on the printed wiring board so as to lie in the space below said upper level IC package, whereby said upper and lower level IC packages are stacked above one another.

2. The multi-level package arrangement recited in claim 1, wherein there is an air gap established between the upper and lower level IC packages stacked above one another.

3. The multi-level package arrangement recited in claim 1, wherein said upper level IC package is a thin small outline package.

4. The multi-level package arrangement recited in claim 1, wherein said lower level IC package is a chip scale package.

5. The multi-level package arrangement recited in claim 1, wherein said upper level IC package and said lower level IC package are different integrated circuit semiconductor packages, said upper level IC package being wider than said lower level IC package.

6. The multi-level package arrangement recited in claim 1, wherein the thickness of the lower level IC package is narrower than the thickness of the upper level IC package.

7. The multi-level package arrangement recited in claim 1, wherein said lower level IC package is a leadless integrated circuit semiconductor package.

8. The multi-level package arrangement recited in claim 7, wherein said leadless lower level IC package is mounted on the printed wiring board by means of electrically conductive solder connections and a first set of contact pads bonded to said printed wiring board.

9. The multi-level package arrangement recited in claim 8, wherein the leads of said upper level IC package are electrically connected to the printed wiring board by means of a second set of contact pads bonded to said printed wiring board, at least some of said first set of contact pads electrically connected to respective ones of at least some of said second set of contact pads.

10. The multi-level package arrangement recited in claim 9, wherein at least some of said first set of contact pads at which said lower level IC package is mounted is electrically connected to respective ones of at least some of said second set of contact pads at which said upper level IC package is mounted by means of electrically conductive traces that extend between said first and second sets of contact pads and run along the surface of the printed wiring board.

11. The multi-level package arrangement recited in claim 9, wherein at least some of said first set of contact pads at which said lower level IC package is mounted are electrically connected to respective ones of at least some of said second set of contact pads at which said upper level IC package is mounted by means of electrically conductive signal lines that extend between said first and second sets of contact pads and run through the interior of the printed wiring board.

12. A memory module having a plurality of multi-level packages mounted on a printed wiring board, each of said multi-level packages comprising a first integrated circuit (IC) semiconductor device mounted on the printed wiring board and having a first size, said first IC device having a plurality of leads by which to mount said first IC device on the printed wiring board, a second IC semiconductor device mounted on the printed wiring board and having a smaller size than the first size of said first IC device, said first and second IC devices being different integrated circuit semiconductor devices, the plurality of leads of said first IC device being sufficiently long to create a space between said first IC device and the printed wiring board, and said second IC device being mounted on the printed wiring board so as to lie in the space below said first IC device, whereby said first and second IC devices are stacked above one another.

13. The memory module recited in claim 12, wherein said plurality of multi-level packages are mounted on opposite sides of the printed wiring board, are mounted on opposite sides of the printed wiring board.

14. The memory module recited in claim 12, wherein the second IC device of each of said multi-level packages is a leadless semiconductor device.

15. The memory module recited in claim 14, wherein said leadless second IC device of each of said multi-level packages is mounted on the printed wiring board by means of electrically conductive solder connections and a set of contact pads bonded to said printed wiring board.

16. The memory module recited in claim 12, wherein there is established an air gap between the first and second IC devices of each of said multi-level packages.

17. A multi-level package arrangement comprising stacked integrated circuit (IC) semiconductor packages mounted on a printed wiring board, said multi-level packaging arrangement comprising:

an upper level IC package having a plurality of leads by which to connect said upper level IC package to the printed wiring board; and a leadless lower level IC package mounted on the printed wiring board by means of a set of contact pads located on said printed wiring board and a set of electrically conductive connections extending between said leadless lower level IC package and said set of contact pads, the plurality of leads of said upper level IC package being sufficiently long to create a space between said upper level IC package and the printed wiring board, said lower level package being mounted on the printed wiring board so as to lie in the space below said upper level IC package, whereby said upper and lower level IC packages are stacked above one another.

18. The multi-level package arrangement recited in claim 17, wherein said electrically conductive connections and said set of contact pads are located between said leadless lower level IC package and the printed wiring board.

19. The multi-level package arrangement recited in claim 17, wherein the footprint of said upper level IC package is larger than the footprint of said leadless lower level IC package.

20. The multi-level package arrangement recited in claim 19, wherein said upper level IC package has the footprint of a thin small outline package and said leadless lower level IC package has the footprint of a chip scale package.

21. A multi-level package arrangement comprising stacked integrated circuit (IC) semiconductor packages mounted on a printed wiring board, said multi-level packaging arrangement comprising:

an upper level IC package having a plurality of leads by which to connect said upper level IC package to the printed wiring board; and a leadless lower level IC package mounted on the printed wiring board, the upper level IC package having a footprint which is larger than the footprint of said leadless lower level IC package, and the plurality of leads of said upper level IC package being sufficiently long to create a space between said upper level IC package and the printed wiring board, said leadless lower level package being mounted on the printed wiring board so as to lie in the space below said upper level IC package, whereby said upper and lower level IC packages are stacked above one another.

* * * * *